United States Patent
Mohamad et al.

(10) Patent No.: US 12,463,588 B2
(45) Date of Patent: Nov. 4, 2025

(54) PHASE NOISE REDUCTION FOR VOLTAGE-CONTROLLED OSCILLATOR USING HARMONIC FILTER

(71) Applicant: QUALCOMM Incorporated, San Diego, CA (US)

(72) Inventors: Sajin Mohamad, San Diego, CA (US); Burcin Serter Ergun, Poway, CA (US); Chiu Keung Tang, San Diego, CA (US); Zhiqin Chen, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/648,871

(22) Filed: Apr. 29, 2024

(65) Prior Publication Data
US 2025/0337357 A1    Oct. 30, 2025

(51) Int. Cl.
*H03B 1/04*    (2006.01)
*H03B 5/12*    (2006.01)

(52) U.S. Cl.
CPC .............. *H03B 1/04* (2013.01); *H03B 5/1228* (2013.01); *H03B 5/1265* (2013.01); *H03B 2201/0208* (2013.01)

(58) Field of Classification Search
CPC ...... H03B 1/04; H03B 5/1228; H03B 5/1265; H03B 2201/0208

USPC .................. 331/177 V, 167, 117 FE
See application file for complete search history.

(56) References Cited

U.S. PATENT DOCUMENTS

| | | | |
|---|---|---|---|
| 7,688,153 B2 | 3/2010 | Jacobsson et al. | |
| 9,490,745 B1 | 11/2016 | Toso et al. | |
| 2008/0266005 A1* | 10/2008 | Jacobsson | H03B 5/124 331/108 A |
| 2011/0163815 A1* | 7/2011 | Bellaouar | H03C 3/0933 331/10 |

FOREIGN PATENT DOCUMENTS

CN        115833751 A    3/2023

* cited by examiner

*Primary Examiner* — Arnold M Kinkead
(74) *Attorney, Agent, or Firm* — Loza & Loza, LLP

(57) ABSTRACT

A system includes a voltage-controlled oscillator (VCO), a first second-order harmonic filter coupled to the VCO, wherein the first second-order harmonic filter includes a first tunable capacitor, and a second second-order harmonic filter coupled to the VCO, wherein the second second-order harmonic filter includes a second tunable capacitor. The system also includes a measurement circuit coupled to the VCO, wherein the measurement circuit is configured to measure a voltage swing of the VCO. The system also includes a control circuit coupled to the measurement circuit, the first tunable capacitor, and the second tunable capacitor.

18 Claims, 7 Drawing Sheets ively, the word "exemplary" is used herein to mean "serving as an example, instance, or illustration." Any aspect described herein as "exemplary" is not necessarily to be construed as preferred or advantageous over other aspects.

PHASE NOISE REDUCTION FOR VOLTAGE-CONTROLLED OSCILLATOR USING HARMONIC FILTER

FIELD

Aspects of the present disclosure relate generally to voltage-controlled oscillators (VCOs), and more particularly, to phase noise reduction for VCOs.

BACKGROUND

A voltage-controlled oscillator (VCO) generates a signal having a frequency that is controlled (i.e., tuned) by an input voltage. For example, a VCO may be used in a phase-locked loop (PLL) to generate a clock signal, a local oscillator signal, or another type of signal having a desired frequency.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a voltage-controlled oscillator (VCO), a first second-order harmonic filter coupled to the VCO, wherein the first second-order harmonic filter includes a first tunable capacitor, and a second second-order harmonic filter coupled to the VCO, wherein the second second-order harmonic filter includes a second tunable capacitor. The system also includes a measurement circuit coupled to the VCO, wherein the measurement circuit is configured to measure a voltage swing of the VCO, and a control circuit coupled to the measurement circuit, the first tunable capacitor, and the second tunable capacitor.

A second aspect relates to a system. The system includes a voltage-controlled oscillator (VCO), wherein the VCO includes an inductor and a voltage-controlled capacitor coupled in parallel between a first node and a second node. The system includes a first second-order harmonic filter coupled to the VCO, wherein the first second-order harmonic filter includes a first tunable capacitor, and a second second-order harmonic filter coupled to the VCO, wherein the second second-order harmonic filter includes a second tunable capacitor. The system also includes a measurement circuit having a first input and a second input, wherein the first input of the measurement circuit is coupled to the first node, the second input of the measurement circuit is coupled to the second node, and the measurement circuit is configured to measure a voltage difference between the first node and the second node. The system also includes a control circuit coupled to the measurement circuit, the first tunable capacitor, and the second tunable capacitor.

A third aspect relates to a method for calibrating a first second-order harmonic filter and a second second-order harmonic filter coupled to a voltage-controlled oscillator (VCO). The first second-order harmonic filter includes a first tunable capacitor and the second second-order harmonic filter includes a second tunable capacitor. The method includes sequentially setting the first tunable capacitor and the second tunable capacitor to each one of multiple capacitance settings, measuring a voltage swing of the VCO for each one of the multiple capacitance settings, and selecting one of the multiple capacitance settings based on the measured voltage swings for the multiple capacitance settings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A voltage-controlled oscillator (VCO) generates a signal having a frequency that is controlled (i.e., tuned) by an input voltage. For example, a VCO may be used in a phase-locked loop (PLL) to generate a clock signal (e.g., for timing the operations of circuits), a local oscillator signal (e.g., for frequency down conversion and/or frequency up conversion), or another type of signal having a desired frequency.

Figure 1:
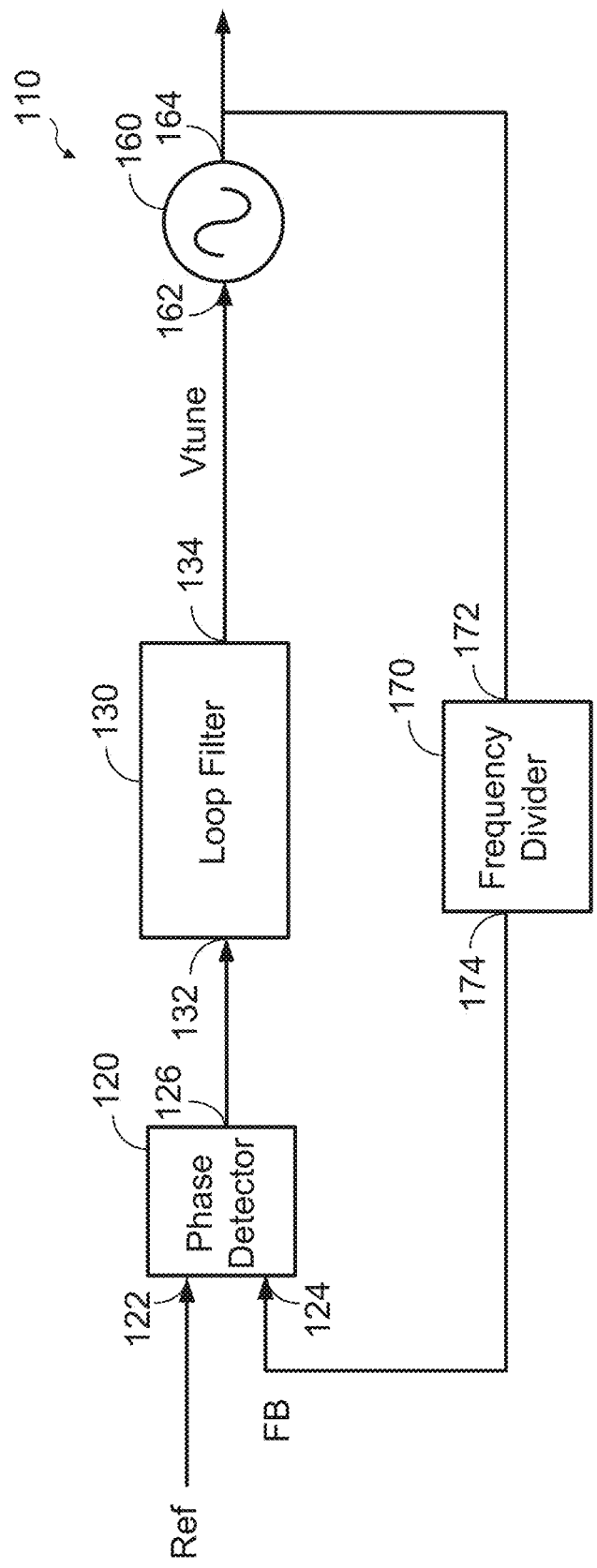
FIG. 1 shows an example of a phase locked loop (PLL) including a VCO according to certain aspects of the present disclosure.

In this regard, FIG. 1 shows an example of a PLL 110 including a VCO 160 according to certain aspects of the present disclosure. The PLL 110 may be used to generate a signal having a desired frequency in a wireless communication system, a micro-processing system, a high-speed data system, etc.

The PLL 110 includes a phase detector 120 (also referred to as a phase frequency detector (PFD)), a loop filter 130, the VCO 160, and a frequency divider 170. The VCO 160 has an input 162 configured to receive a control voltage (labeled "Vtune") and an output 164 configured to output an output signal. The VCO 160 is configured to tune the frequency of the output signal based on the control voltage. The output signal of the VCO 160 provides the output signal of the PLL 110. The output signal of the PLL 110 may be used as a clock signal, a local oscillator signal, or another type of signal.

The output signal of the VCO 160 is fed back to the phase detector 120 via a feedback loop including the frequency divider 170. The frequency divider 170 has an input 172 coupled to the output 164 of the VCO 160 and an output 174 coupled to the phase detector 120. The frequency divider 170 is configured to receive the output signal of the VCO 160 at the input 172, divide the frequency of the output signal to generate a feedback signal (labeled "FB"), and output the feedback signal to the phase detector 120 via the output 174. The feedback signal has a frequency equal to $f_{out}/N$, where $f_{out}$ is the frequency of the output signal of the VCO 160, and N is a divider of the frequency divider 170.

The phase detector 120 has a first input 122, a second input 124 coupled to the output 174 of the frequency divider 170, and an output 126 coupled to the loop filter 130. The phase detector 120 is configured to receive a reference signal (labeled "Ref") at the first input 122 and receive the feedback signal (labeled "FB") at the second input 124. The reference signal provides a reference frequency for the PLL 110 and may come from a crystal oscillator or another stable oscillator. The phase detector 120 is configured to detect a phase difference (i.e., a phase error) between the reference signal and the feedback signal, and output a phase signal at the output 126 indicating the detected phase difference (i.e., phase error).

The loop filter 130 has an input 132 coupled to the output 126 of the phase detector 120 and an output 134 coupled to the input 162 of the VCO 160. The loop filter 130 is configured to receive the phase signal from the phase detector 120, generate the control voltage (labeled "Vtune") based on the phase signal, and output the control voltage to the VCO 160 to tune the frequency of the VCO 160. The loop filter 130 may include a charge pump and a capacitor, in which the charge pump sources current to or sinks current from the capacitor depending on whether the reference signal leads or lags the feedback signal (as indicated by the phase signal), and the capacitor integrates the current to generate the control voltage. However, it is to be appreciated that the loop filter 130 is not limited to this example.

The feedback loop of the PLL 110 causes the control voltage to tune the frequency of the VCO 160 in a direction that reduces the phase difference (i.e., phase error) between the feedback signal and the reference signal. When the PLL 110 is locked, the frequency of the feedback signal is approximately equal to the frequency of the reference signal. Since the frequency of the feedback signal is approximately equal to the frequency of the output signal of the VCO 160 divided by N, this causes the frequency of the output signal of the VCO 160 to be approximately equal to N times the frequency of the reference signal. Thus, the PLL 110 multiplies the frequency of the reference signal by N. The frequency of the output signal of the VCO 160 (which provides the output signal of the PLL 110) may be set to a desired frequency, for example, by setting the value of N accordingly.

Figure 2:
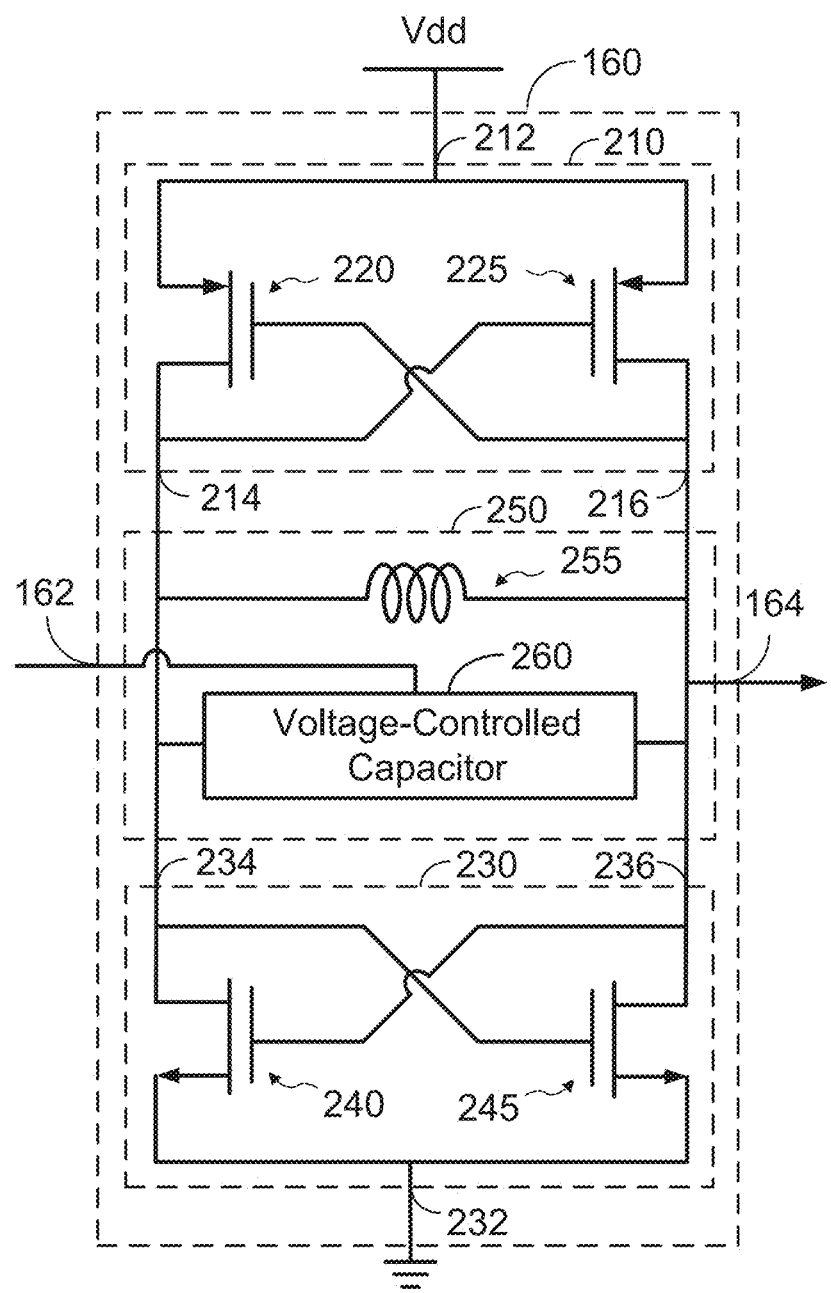
FIG. 2 shows an exemplary implementation of a voltage-controlled oscillator (VCO) according to certain aspects of the present disclosure.

FIG. 2 shows an exemplary implementation of the VCO 160 according to certain aspects. In this example, the VCO 160 includes an inductor-capacitor (LC) tank 250, a first drive circuit 210, and a second drive circuit 230. The drive circuits 210 and 230 are configured to drive the LC tank 250 to generate the output signal at the output 164, as discussed further below.

The first drive circuit 210 has a first terminal 212, a second terminal 214, and a third terminal 216. The first terminal 212 is coupled to a supply rail providing a supply voltage Vdd. In the example in FIG. 2, the first drive circuit 210 includes a first transistor 220 (e.g., a first p-type field effect transistor (PFET)) and a second transistor 225 (e.g., a second PFET). In this example, the sources of the transistors 220 and 225 are coupled to the first terminal 212, the drain of the first transistor 220 is coupled to the second terminal 214, and the drain of the second transistor 225 is coupled to the third terminal 216. The transistors 220 and 225 are cross-coupled, in which the gate of the first transistor 220 is coupled to drain of the second transistor 225, and the gate of the second transistor 225 is coupled to the drain of the first transistor 220.

The second drive circuit 230 has a first terminal 232 coupled to ground, a second terminal 234, and a third terminal 236. In the example in FIG. 2, the second drive circuit 230 includes a third transistor 240 (e.g., a first n-type field effect transistor (NFET)) and a fourth transistor 245 (e.g., a second NFET). In this example, the sources of the transistors 240 and 245 are coupled to the first terminal 232, the drain of the third transistor 240 is coupled to the second terminal 234, and the drain of the fourth transistor 245 is coupled to the third terminal 236. The transistors 240 and 245 are cross-coupled, in which the gate of the third transistor 240 is coupled to drain of the fourth transistor 245, and the gate of the fourth transistor 245 is coupled to the drain of the third transistor 240.

The LC tank 250 includes an inductor 255 and a voltage-controlled capacitor 260. The inductor 255 and the voltage-controlled capacitor 260 may be coupled in parallel between the second terminal 214 and the third terminal 216 of the first drive circuit 210. The inductor 255 and the voltage-controlled capacitor 260 may also be coupled in parallel between the second terminal 234 and the third terminal 236 of the second drive circuit 230. However, it is to be appreciated that the LC tank 250 is not limited to this example.

In this example, the output 164 of the VCO 160 is coupled to the LC tank 250, as shown in FIG. 2. As a result, the frequency of the output signal at the output 164 is equal to the resonant frequency of the LC tank 250, which is approximately equal to:

$$f = \frac{1}{2\pi\sqrt{LC}} \quad (1)$$

where f is the resonant frequency, L is the inductance of the inductor 255, and C is the capacitance of the voltage-controlled capacitor 260. As shown in Eq. 1, the resonant frequency of the LC tank 250 (and hence the output frequency of the VCO 160) may be tuned by tuning the capacitance of the voltage-controlled capacitor 260. In this example, the first drive circuit 210 and the second drive circuit 230 drive the LC tank 250, which causes the LC tank 250 to oscillate at approximately the resonant frequency of the LC tank 250.

In this example, the voltage-controlled capacitor 260 is coupled to the input 162 of the VCO 160. The voltage-controlled capacitor 260 is configured to tune (i.e., adjust) the capacitance of the voltage-controlled capacitor 260 based on the control voltage (labeled "Vtune") at the input 162. Since the resonant frequency of the LC tank 250 (and hence the output frequency of the VCO 160) depends on the capacitance of the voltage-controlled capacitor 260, the voltage-controlled capacitor 260 is able to tune the output frequency of the VCO 160 based on the control voltage by tuning the capacitance of the voltage-controlled capacitor 260 based on the control voltage. The voltage-controlled capacitor 260 may include one or more varactors (e.g., one or more metal-oxide-semiconductor (MOS) varactors, one or more diodes, etc.), but is not limited to this example.

It is to be appreciated that the LC tank 250 may include one or more additional capacitors (not shown) coupled in parallel with the inductor 255 in some implementations. For example, the voltage-controlled capacitor 260 may tune the frequency of the VCO 160 within a frequency range, and the one or more additional capacitors may include a digitally controlled capacitor for setting the frequency range. In these implementations, the capacitance in equation 1 may correspond to the combined capacitance of the voltage-controlled capacitor 260 and the one or more additional capacitors.

A clock signal with low jitter may be required in high-speed circuits (e.g., to prevent timing errors in the high-speed circuits). In cases where the clock signal is generated by a PLL (e.g., PLL 110) including the VCO 160, low jitter may be achieved by reducing the phase noise of the PLL. The VCO 160 may be a dominant contributor to the phase noise of the PLL. Thus, the phase noise of the PLL may be reduced by reducing the phase noise of the VCO 160.

Figure 3:
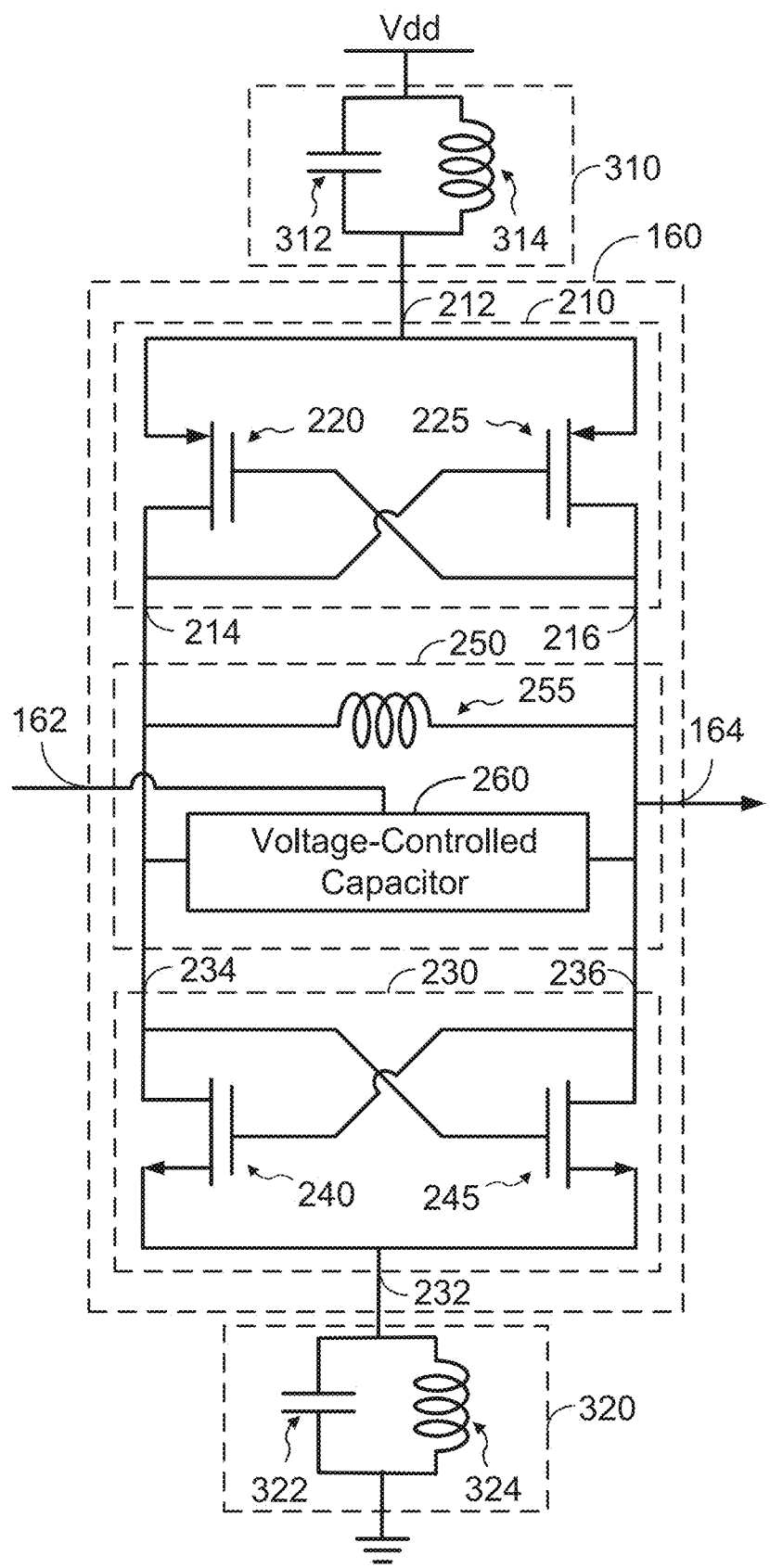
FIG. 3 shows an example of second-order harmonic filters coupled to the VCO according to certain aspects of the present disclosure.

One technique to improve the phase noise is using one or more second-order harmonic filters to filter out the second-order harmonic frequency of the VCO 160. The second-order harmonic frequency of the VCO 160 is twice the output frequency of the VCO 160, which is approximately equal to the resonant frequency of the LC tank 250. In this regard, FIG. 3 shows an example of a first second-order harmonic filter 310 and a second second-order harmonic filter 320 coupled to the VCO 160 for filtering out the second-order harmonic frequency in the VCO 160. A second-order harmonic filter may also be referred to as simply a harmonic filter or another term.

The first second-order harmonic filter 310 is coupled between the VCO 160 and the supply rail. The first second-order harmonic filter 310 includes a first capacitor 312 and a first inductor 314 coupled in parallel between the first terminal 212 of the first drive circuit 210 and the supply rail. The capacitance of the first capacitor 312 and the inductance of the first inductor 314 may be chosen such that the first second-order harmonic filter 310 has a high alternating current (AC) impedance at the second-order harmonic frequency of the VCO 160 in order to filter out the second-order harmonic frequency. For example, the first second-order harmonic filter 310 may have a high AC impedance at the second-order harmonic frequency of the VCO 160 when the resonant frequency of the first second-order harmonic filter 310 is approximately equal to twice the resonant frequency of the LC tank 250.

The second second-order harmonic filter 320 is coupled between the VCO 160 and ground. The second second-order harmonic filter 320 includes a second capacitor 322 and a second inductor 324 coupled in parallel between the first terminal 232 of the second drive circuit 230 and ground. The capacitance of the second capacitor 322 and the inductance of the second inductor 324 may be chosen such that the second second-order harmonic filter 320 has a high AC impedance at the second-order harmonic frequency of the VCO 160 in order to filter out the second-order harmonic frequency. For example, the second second-order harmonic filter 320 may have a high AC impedance at the second-order harmonic frequency of the VCO 160 when the resonant frequency of the second second-order harmonic filter 320 is approximately equal to twice the resonant frequency of the LC tank 250.

A challenge with using the second-order harmonic filters 310 and 320 to filter out the second-order harmonic frequency of the VCO 160 is that the capacitances of the capacitors 312 and 322 and/or the inductances of the inductors 314 and 324 on the chip (silicon die) may deviate from the capacitances and/or the inductances in the filter design (e.g., due to process variation and/or one or more other factor). As a result, the phase noise improvement provided by the second-order harmonic filters 310 and 320 may be lower than expected in practice.

To address the above, aspects of the present disclosure provide each of the second-order harmonic filters 310 and 320 with a respective tunable capacitor (i.e., variable capacitor). In certain aspects, the tunable capacitors are set to different capacitance settings and an output voltage swing of the VCO 160 is measured for each of the capacitance settings. In these aspects, the capacitance setting resulting in the largest measured output voltage swing (which corresponds to a low phase noise) is selected. The above features and other features of the present disclosure are discussed further below.

Figure 4:
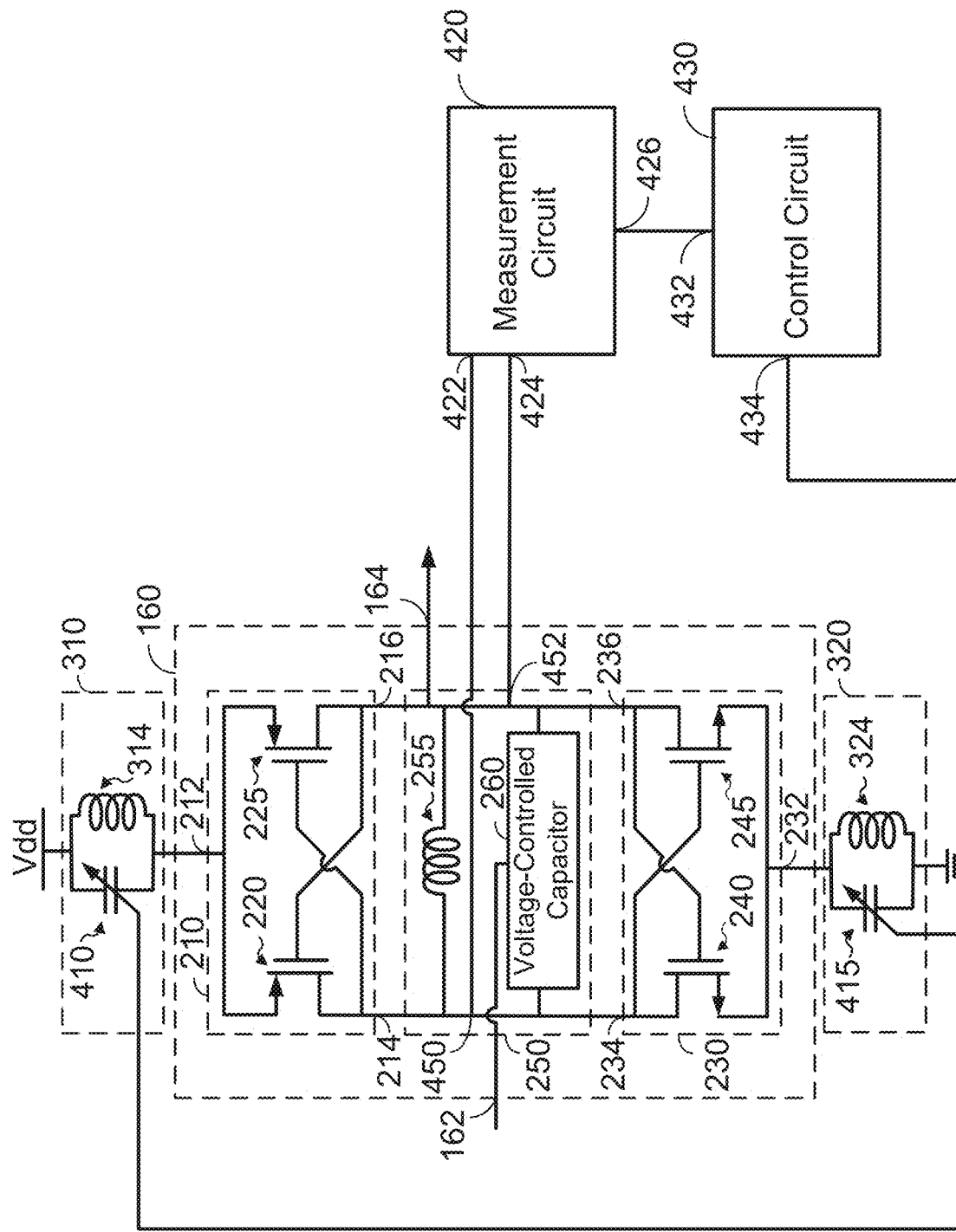
FIG. 4 shows an example of a measurement circuit and a control circuit for calibrating tunable capacitors in the second-order harmonic filters according to certain aspects of the present disclosure.

FIG. 4 shows an example in which the first second-order harmonic filter 310 includes a first tunable capacitor 410 coupled in parallel with the first inductor 314, and the second second-order harmonic filter 320 includes a second tunable capacitor 415 coupled in parallel with the second inductor 324. A tunable capacitor may also be referred to as a variable capacitor, a programmable capacitor, or another term.

The capacitance of each of the tunable capacitors 410 and 415 may be set by a control signal. In certain aspects, the control signal includes a digital control code (e.g., a binary code, a thermometer code, etc.). For example, the digital control code may have multiple possible digital values where each digital value corresponds to a respective capacitance setting for the first tunable capacitor 410 and the second tunable capacitor 415. In this example, each of the tunable capacitors 410 and 415 may include a switchable capacitor bank or another type of digitally programmable capacitor. However, it is to be appreciated that the tunable capacitors 410 and 415 are not limited to this example.

FIG. 4 also shows an example of a measurement circuit 420 and a control circuit 430 according to certain aspects. The measurement circuit 420 is configured to measure an output voltage swing of the VCO 160 and the control circuit 430 is configured to tune the tunable capacitors 410 and 415 to different capacitance settings, as discussed further below.

In the example shown in FIG. 4, the measurement circuit 420 includes a first input 422, a second input 424, and an output 426. The first input 422 is coupled to a first node 450 in the VCO 160 and the second input 424 is coupled to a second node 452 in the VCO 160, where the LC tank 250 is between the first node 450 and the second node 452 (e.g., the inductor 255 and the voltage-controlled capacitor 260 are coupled in parallel between the first node 450 and the second node 452). In this example, the measurement circuit 420 is configured to measure the output voltage swing of the VCO 160 by measuring the voltage difference between the first node 450 and the second node 452 (i.e., the voltage across the LC tank 250). The measurement circuit 420 is configured to output a measurement signal (e.g., a digital signal) at the output 426 indicating the measured output voltage swing of the VCO 160 (e.g., the voltage across the LC tank 250).

The control circuit 430 has an input 432 and an output 434. The input 432 is coupled to the output 426 of the measurement circuit 420 to receive the measurement signal indicating the measured output voltage swing. The output 434 is coupled to the tunable capacitors 410 and 415. The control circuit 430 is configured to generate and output the control signal for the tunable capacitors 410 and 415 via the output 434 to tune the capacitances of the tunable capacitors 410 and 415. For the example where the control signal includes the digital control code, the control circuit 430 may tune the capacitances of the tunable capacitors 410 and 415 by changing the digital value of the digital control code. In the example in FIG. 4, the control circuit 430 outputs the control signal to both tunable capacitors 410 and 415. Thus, in this example, the tunable capacitors 410 and 415 are set to the same capacitance setting at a given time. However, it is to be appreciated that the present disclosure is not limited to this example. In other implementations, the control circuit 430 may independently set the capacitances of the tunable capacitors.

The control circuit 430 may be implemented with gated logic, a field programmable gate array (FPGA), programmable logic devices (PLDs), discrete hardware circuits, and/or other suitable hardware. The control circuit 430 may also be implemented with a processor configured to execute instructions stored in a memory for performing one or more operations of the control circuit 430 described herein.

Exemplary operations of the measurement circuit 420 and the control circuit 430 during calibration will now be disclosed according to certain aspects, in which the capacitance setting for the first tunable capacitor 410 and the second tunable capacitor 415 is calibrated to achieve low phase noise for the VCO 160, as discussed further below.

In this example, the control circuit 430 sequentially sets the tunable capacitors 410 and 415 to each one of multiple capacitance settings using the control signal. For the example where the control signal includes the digital control code, the control circuit 430 may sequentially set the tunable capacitors 410 and 415 to each one of the capacitance settings by sequentially setting the digital control code to each one of multiple digital values. In this example, each of the multiple digital values corresponds to a respective one of the capacitance settings.

For each one of the capacitance settings, the measurement circuit 420 measures the output voltage swing of the VCO 160. For example, the measurement circuit 420 may measure the output voltage swing of the VCO 160 by measuring the voltage difference between the first input 422 and the second input 424 (i.e., the voltage across the LC tank 250). For each one of the capacitance settings, the measurement circuit 420 outputs a measurement signal to the control circuit 430 via the output 426 indicating the measured output voltage swing for the capacitance setting. Thus, for each one of the capacitance settings, the control circuit 430 receives a measurement signal from the measurement circuit 420 indicating the corresponding measured output voltage swing.

The control circuit 430 may then select the capacitance setting from among the multiple capacitance settings corresponding to the largest one of the measured output voltage swings, which may correspond to the maximum phase noise improvement. The control circuit 430 may then set the tunable capacitors 410 and 415 to the selected capacitance setting to provide low phase noise during normal operation of the VCO 160 (also referred to as mission mode). For example, during normal operation, the VCO 160 may be used to tune the output frequency of the PLL 110 based on the control voltage (labeled "Vtune"). However, it is to be appreciated the VCO 160 is not limited to this example, and that the VCO 160 may be used in other applications.

Thus, the control circuit 430 calibrates the capacitance setting for the first tunable capacitor 410 and the second tunable capacitor 415 to achieve low phase noise for the VCO 160. The calibration compensates for variation in the capacitances of the tunable capacitors 410*a* and 415 and/or variation in the inductances of the inductors 314 and 324 (e.g., due to process variation and/or one or more other factor). This is because the control circuit 430 finds the capacitance setting for the first tunable capacitor 410 and the second tunable capacitor 415 that results in a large output voltage swing (which corresponds to low phase noise) for a given instance of the VCO 160.

In this example, the control circuit 430 calibrates the capacitance setting for the first tunable capacitor 410 and the second tunable capacitor 415 based on the measured output voltage swing of the VCO 160 (e.g., the voltage across the LC tank 250). The measured output voltage swing of the VCO 160 allows the control circuit 430 to calibrate both second-order harmonic filters 310 and 320. In contrast, other voltages used for calibration (e.g., the voltage at the sources of the transistors 240 and 245) may only be used to calibrate one of the harmonic filters 310 and 320 (e.g., the second second-order harmonic filter 320). In addition, the output voltage swing of the VCO 160 may be much larger than the other voltages used for calibration (e.g., the voltage at the sources of the transistors 240 and 245). The larger voltage may be easier to measure, which improves the precision of the calibration.

Figure 5:
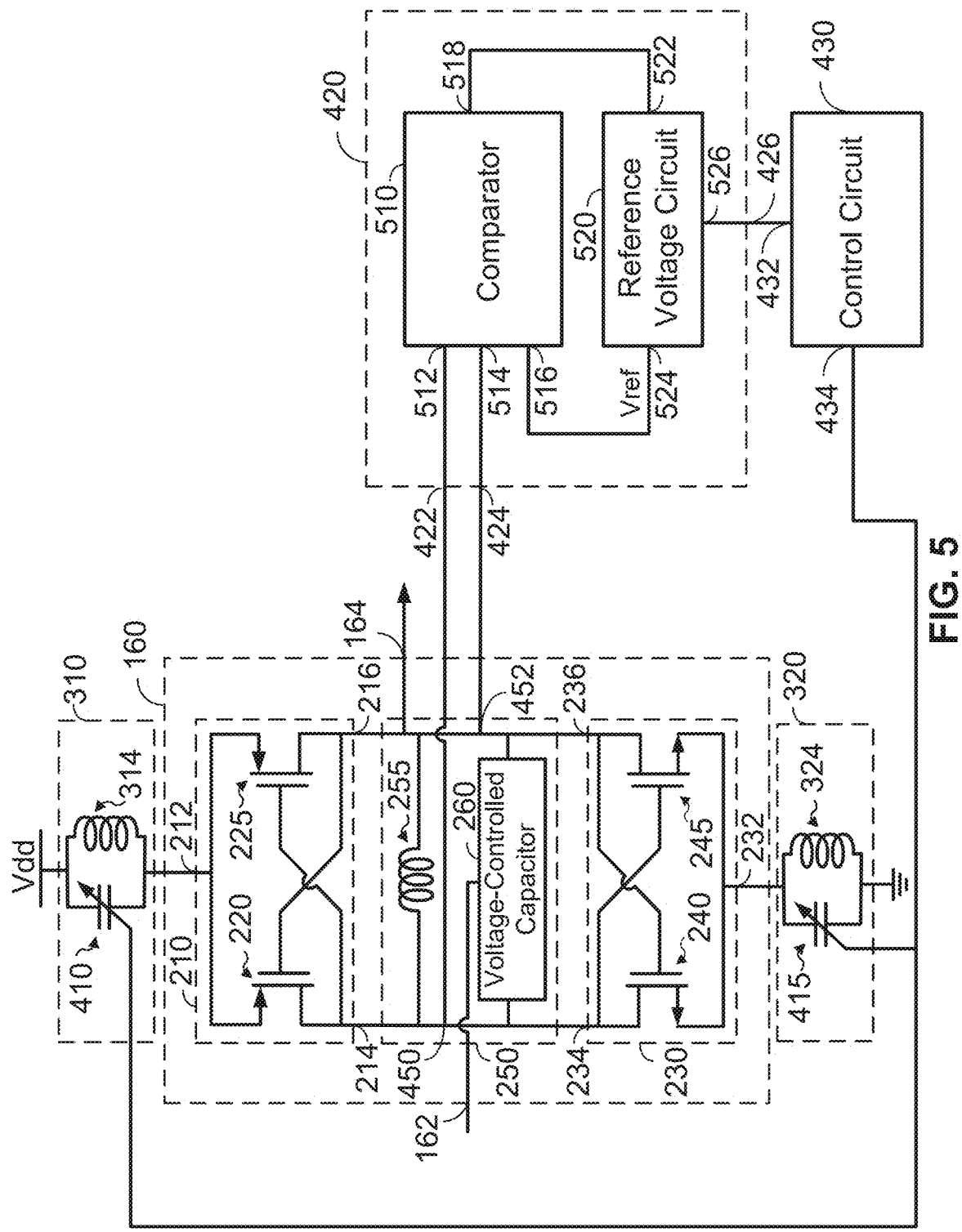
FIG. 5 shows an exemplary implementation of the measurement circuit according to certain aspects of the present disclosure.

FIG. 5 shows an exemplary implementation of the measurement circuit 420 according to certain aspects. In this example, the measurement circuit 420 includes a comparator 510 and a reference voltage circuit 520.

The comparator 510 has a first input 512, a second input 514, a third input 516, and an output 518. The first input 512 is coupled to the first node 450 in the VCO 160 and the second input 514 is coupled to the second node 452 in the VCO 160. This allows the comparator 510 to detect the output voltage swing of the VCO 160 by detecting the voltage difference between the first node 450 and the second node 452. The third input 516 is configured to receive a reference voltage (labeled "Vref") from the reference voltage circuit 520, as discussed further below.

The comparator 510 is configured to compare the output voltage swing with the reference voltage, and output a compare signal at the output 518 based on the comparison. For example, the comparator 510 may output a logic one when the reference voltage is greater than the output voltage swing and output a logic zero when the reference voltage is less than the output voltage swing, or vice versa.

In this example, the reference voltage circuit 520 has an input 522, a first output 524, and a second output 526. The input 522 is coupled to the output 518 of the comparator 510, the first output 524 is coupled to the third input 516 of the comparator 510, and the second output 526 is coupled to the input 432 of the control circuit 430. The reference voltage circuit 520 is configured to generate the reference voltage and output the reference voltage to the third input 516 of the comparator 510 via the first output 524.

In certain aspects, the reference voltage circuit 520 is configured to sweep the reference voltage to difference voltage levels and monitor the output 518 of the comparator 510 for each voltage level. In this example, the output 518 of the comparator 510 toggles (i.e., changes logic states) when the voltage level of the reference voltage is approximately equal to the output voltage swing. This allows the reference voltage circuit 520 to measure the output voltage swing by determining the voltage level of the reference voltage at which the output 518 of the comparator 510 toggles. In this example, the reference voltage circuit 520 may determine the voltage level of the reference voltage at which the output 518 of the comparator 510 toggles. The reference voltage circuit 520 may then output a signal to the control circuit 430 via the output 526 indicating the determined voltage level of the reference voltage (which provides a measurement of the output voltage swing in this example).

It is to be appreciated that the measurement circuit 420 is not limited to the exemplary implementation shown in FIG. 5. For example, the measurement circuit 420 may be implemented with various types of analog-to-digital converters configured to convert a voltage into a digital signal.

Figure 6:
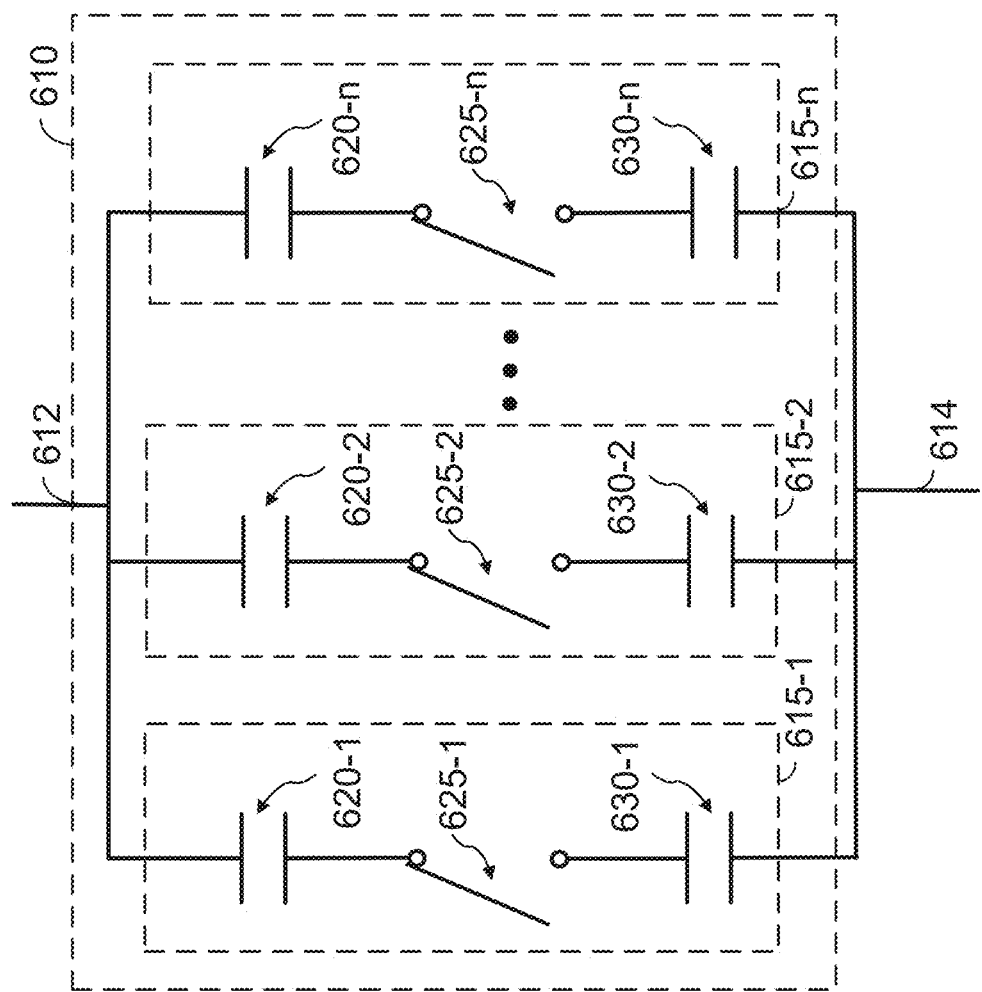
FIG. 6 shows an exemplary implementation of a capacitor bank according to certain aspects of the present disclosure.

FIG. 6 shows an example of capacitor bank 610 according to certain aspects of the present disclosure. The capacitor bank 610 may be used to implement each of the tunable capacitors 410 and 415 in certain aspects (i.e., each of the tunable capacitors 410 and 415 may be a separate instance of the capacitor bank 610). The capacitor bank 610 includes switchable capacitors 615-1 to 615-$n$ coupled in parallel between a first terminal 612 and a second terminal 614. The control circuit 430 sets the capacitance of the capacitor bank 610 by controlling which ones of the switchable capacitors 615-1 to 615-$n$ are switched on using the control signal, as discussed further below. In this example, each of the capacitance settings discussed above may cause a different combination of the switchable capacitors 615-1 to 615-$n$ to turned on. The capacitance of the capacitor bank 610 for a given capacitance setting may be approximately equal to the sum of the capacitances of the switchable capacitors 615-1 to 615-$n$ that are turned on for the capacitance setting.

In the example in FIG. 6, each of the switchable capacitors 615-1 to 615-$n$ includes respective capacitors 620-1 to 620-$n$ and 630-1 to 630-$n$ and a respective switch 625-1 to 625-$n$ coupled in series between the first terminal 612 and the second terminal 614. In some implementations, the capacitors 620-1 to 620-$n$ and 630-1 to 630-$n$ may be binary weighted. However, it is to be appreciated that the present disclosure is not limited to this example. Each of the switches 625-1 to 625-$n$ may be implemented with a respective transistor or another types of switch.

In this example, the control circuit 430 switches on a switchable capacitor (e.g., one of the switchable capacitors 615-1 to 615-$n$) by turning on the respective switch (e.g., respective one of the switches 625-1 to 615-$n$), and switches off the switchable capacitor by turning off the respective switch. For the example where the control signal includes a digital control code (also referred to as a cap code), the digital control code may include multiple bits where each bit controls the on/off state of a respective one of the switchable capacitors 615-1 to 615-$n$. For example, a switchable capacitor (e.g., one of the switchable capacitors 615-1 to 615-$n$) may turn one when the respective bit is logic one and turn off when the respective bit is logic zero, or vice versa. In this example, each of the capacitance settings discussed above corresponds to a respective combination of bit values for the digital control code.

As discussed above, the capacitor bank 610 may be used to implement each of the tunable capacitors 410 and 415. For the example of the first tunable capacitor 410, the first terminal 612 may be coupled to the supply rail and the second terminal 614 may be coupled to the first drive circuit 210. For the example of the second tunable capacitor 415, the first terminal 612 may be coupled to the second drive circuit 230 and the second terminal 614 may be coupled to ground.

It is to be appreciated that the capacitor bank 610 is not limited to the arrangement of capacitors and switches shown in the example in FIG. 6. In general, the capacitor bank 610 may include switchable capacitors (e.g., switchable capacitors 615-1 to 615-$n$) coupled in parallel. Each of the switchable capacitors includes one or more capacitors and one or more switches coupled in series, in which the on/off states of the one or more switches are controlled by the control signal from the control circuit 430.

Figure 7:
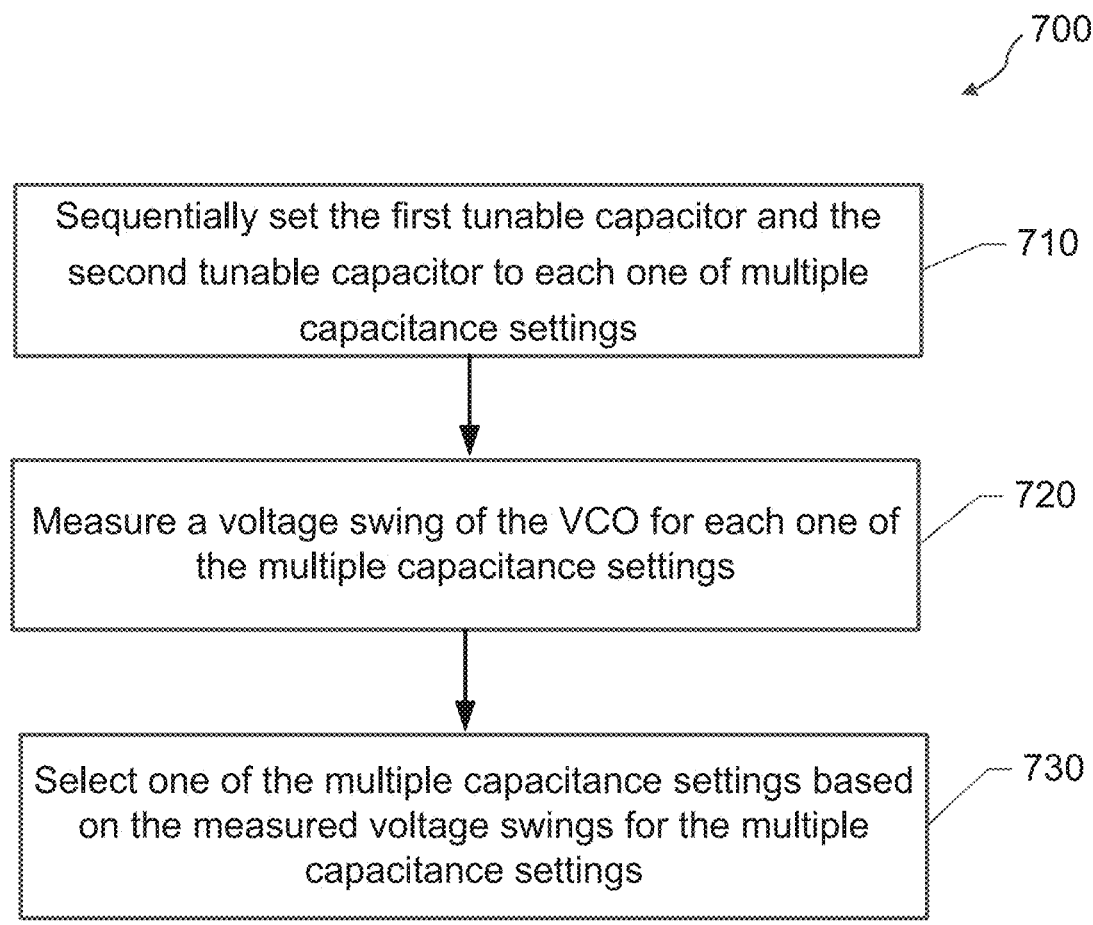
FIG. 7 is a flowchart illustrating a method for calibrating second-order harmonic filters according to certain aspects of the present disclosure.

FIG. 7 illustrates a method 700 for calibrating a first second-order harmonic filter and a second second-order harmonic filter coupled to a voltage-controlled oscillator (VCO). The first second-order harmonic filter may correspond to the first second-order harmonic filter 310 and the second second-order harmonic filter may correspond to the second second-order harmonic filter 320. The first second-order harmonic filter includes a first tunable capacitor (e.g., the first tunable capacitor 410) and the second second-order harmonic filter includes a second tunable capacitor (e.g., the second tunable capacitor 415).

At block 710, the first tunable capacitor and the second tunable capacitor are sequentially set to each one of multiple capacitance settings. For example, the control circuit 430 may sequentially set the first tunable capacitor and the second tunable capacitor to each one of the multiple capacitance settings.

At block 720, a voltage swing of the VCO is measured for each one of the multiple capacitance settings. For example, the measurement circuit 420 may measure the voltage swing.

At block 730, one of the multiple capacitance settings is selected based on the measured voltage swings for the multiple capacitance settings. For example, the control circuit 430 may select the one of the multiple capacitance settings. In certain aspects, the selected one of the multiple capacitance settings corresponds to a largest (i.e., maximum) one of the measured voltage swings for the multiple capacitance settings.

In certain aspects, the VCO includes an inductor-capacitor (LC) tank (e.g., the LC tank 250). In these aspects, measuring the voltage swing of the VCO for each one of the multiple capacitance settings may include measuring a voltage across the LC tank for each one of the multiple capacitance settings (e.g., measuring the voltage difference between the nodes 450 and 452).

In certain aspects, sequentially setting the first tunable capacitor and the second tunable capacitor to each one of the multiple capacitance settings includes outputting a digital control code to the first tunable capacitor and the second tunable capacitor, and sequentially setting the digital control code to each of one multiple digital values, wherein each one of the multiple digital values corresponds to a respective one of the multiple capacitance settings. For the example where the digital control code includes multiple bits, each one of the digital values corresponds to a respective combination of bit values for the digital control code.

It is to be appreciated that the control circuit 430 may be coupled to each of the tunable capacitors 410 and 415 via multiple parallel lines. For example, for the example where the control signal includes the digital control signal including multiple bits, each one of the lines may carry a respective one of the bits. In this example, the output 434 of the control circuit 430 may include multiple outputs where each output is coupled to a respective one of the parallel lines.

1. A system, comprising:
 a voltage-controlled oscillator (VCO);
 a first second-order harmonic filter coupled to the VCO, wherein the first second-order harmonic filter includes a first tunable capacitor;
 a second second-order harmonic filter coupled to the VCO, wherein the second second-order harmonic filter includes a second tunable capacitor;

a measurement circuit coupled to the VCO, wherein the measurement circuit is configured to measure a voltage swing of the VCO; and a control circuit coupled to the measurement circuit, the first tunable capacitor, and the second tunable capacitor.

2. The system of clause 1, wherein:

the control circuit is configured to sequentially set the first tunable capacitor and the second tunable capacitor to each one of multiple capacitance settings; and the measurement circuit is configured to measure the voltage swing for each one of the multiple capacitance settings.

3. The system of clause 2, wherein:

the measurement circuit is configured to indicate the measured voltage swing for each one of the multiple capacitance settings to the control circuit; and the control circuit is configured to select one of the multiple capacitance settings based on the measured voltage swings for the multiple capacitance settings.

4. The system of clause 3, wherein the one of the multiple capacitance settings corresponds to a largest one of the measured voltage swings for the multiple capacitance settings.

5. The system of any one of clauses 2 to 4, wherein the control circuit is configured to tune the first tunable capacitor and the second tunable capacitor using a digital control code, and each one of the multiple capacitance settings corresponds to a respective digital value of the digital control code.

6. The system of any one of clauses 1 to 5, wherein the VCO comprises an inductor-capacitor (LC) tank comprising:

an inductor; and a voltage-controlled capacitor coupled in parallel with the inductor.

7. The system of clause 6, wherein the measurement circuit has a first input and a second input, the LC tank is coupled between the first input and the second input, and the measurement circuit is configured to measure a voltage difference between the first input and the second input.

8. The system of clause 6 or 7, wherein the VCO further comprises at least one drive circuit configured to drive the LC tank.

9. The system of any one of clauses 1 to 8, wherein:

the first second-order harmonic filter further includes a first inductor coupled in parallel with the first tunable capacitor; and the second second-order harmonic filter further includes a second inductor coupled in parallel with the second tunable capacitor.

10. The system of clause 9, wherein the first second-order harmonic filter is coupled between the VCO and a supply rail, and the second second-order harmonic filter is coupled between the VCO and a ground.

11. The system of any one of clauses 1 to 10, further comprising:

a phase detector having a first input, a second input, and an output, wherein the first input is configured to receive a reference signal;

a frequency divider coupled between the VCO and the second input of the phase detector; and a loop filter coupled between the output of the phase detector and the VCO.

12. The system of any one of clauses 1 to 11, wherein the first tunable capacitor comprises switchable capacitors coupled in parallel between a supply rail and the VCO.

13. A system, comprising:

a voltage-controlled oscillator (VCO), wherein the VCO includes an inductor and a voltage-controlled capacitor coupled in parallel between a first node and a second node;

a first second-order harmonic filter coupled to the VCO, wherein the first second-order harmonic filter includes a first tunable capacitor;

a second second-order harmonic filter coupled to the VCO, wherein the second second-order harmonic filter includes a second tunable capacitor;

a measurement circuit having a first input and a second input, wherein the first input of the measurement circuit is coupled to the first node, the second input of the measurement circuit is coupled to the second node, and the measurement circuit is configured to measure a voltage difference between the first node and the second node; and a control circuit coupled to the measurement circuit, the first tunable capacitor, and the second tunable capacitor.

14. The system of clause 13, wherein:

the control circuit is configured to sequentially set the first tunable capacitor and the second tunable capacitor to each one of multiple capacitance settings; and the measurement circuit is configured to measure the voltage difference between the first node and the second node for each one of the multiple capacitance settings.

15. The system of clause 14, wherein:

the measurement circuit is configured to indicate the measured voltage difference for each one of the multiple capacitance settings to the control circuit; and the control circuit is configured to select one of the multiple capacitance settings based on the measured voltage differences for the multiple capacitance settings.

16. The system of clause 15, wherein the one of the multiple capacitance settings corresponds to a largest one of the measured voltage differences for the multiple capacitance settings.

17. A method for calibrating a first second-order harmonic filter and a second second-order harmonic filter coupled to a voltage-controlled oscillator (VCO), wherein the first second-order harmonic filter includes a first tunable capacitor and the second second-order harmonic filter includes a second tunable capacitor, the method comprising:

sequentially setting the first tunable capacitor and the second tunable capacitor to each one of multiple capacitance settings;

measuring a voltage swing of the VCO for each one of the multiple capacitance settings; and selecting one of the multiple capacitance settings based on the measured voltage swings for the multiple capacitance settings.

18. The method of clause 17, wherein the VCO includes an inductor-capacitor (LC) tank, and measuring the voltage swing of the VCO for each one of the multiple capacitance settings comprises measuring a voltage across the LC tank for each one of the multiple capacitance settings.

19. The method of clause 18, wherein the one of the multiple capacitance settings corresponds to a largest one of the measured voltage swings for the multiple capacitance settings.

20. The method of any one of clauses 17 to 19, wherein sequentially setting the first tunable capacitor and the second tunable capacitor to each one of the multiple capacitance settings comprises:
outputting a digital control code to the first tunable capacitor and the second tunable capacitor; and
sequentially setting the digital control code to each of one multiple digital values, wherein each one of the multiple digital values corresponds to a respective one of the multiple capacitance settings.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 90 percent of the stated value to 110 percent of the stated value.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a voltage-controlled oscillator (VCO);
a first second-order harmonic filter coupled to the VCO, wherein the first second-order harmonic filter includes a first tunable capacitor;
a second second-order harmonic filter coupled to the VCO, wherein the second second-order harmonic filter includes a second tunable capacitor;
a measurement circuit coupled to the VCO, wherein the measurement circuit is configured to measure a voltage swing of the VCO; and
a control circuit coupled to the measurement circuit, the first tunable capacitor, and the second tunable capacitor, wherein:
the control circuit is configured to sequentially set the first tunable capacitor and the second tunable capacitor to each one of multiple capacitance settings; and
the measurement circuit is configured to measure the voltage swing for each one of the multiple capacitance settings.

2. The system of claim 1, wherein:
the measurement circuit is configured to indicate the measured voltage swing for each one of the multiple capacitance settings to the control circuit; and
the control circuit is configured to select one of the multiple capacitance settings based on the measured voltage swings for the multiple capacitance settings.

3. The system of claim 2, wherein the one of the multiple capacitance settings corresponds to a largest one of the measured voltage swings for the multiple capacitance settings.

4. The system of claim 1, wherein the control circuit is configured to tune the first tunable capacitor and the second tunable capacitor using a digital control code, and each one of the multiple capacitance settings corresponds to a respective digital value of the digital control code.

5. The system of claim 1, wherein the VCO comprises an inductor-capacitor (LC) tank comprising:
an inductor; and
a voltage-controlled capacitor coupled in parallel with the inductor.

6. The system of claim 5, wherein the measurement circuit has a first input and a second input, the LC tank is coupled between the first input and the second input, and the measurement circuit is configured to measure a voltage difference between the first input and the second input.

7. The system of claim 5, wherein the VCO further comprises at least one drive circuit configured to drive the LC tank.

8. The system of claim 1, wherein:
the first second-order harmonic filter further includes a first inductor coupled in parallel with the first tunable capacitor; and
the second second-order harmonic filter further includes a second inductor coupled in parallel with the second tunable capacitor.

9. The system of claim 8, wherein the first second-order harmonic filter is coupled between the VCO and a supply rail, and the second second-order harmonic filter is coupled between the VCO and a ground.

10. The system of claim 1, further comprising:
a phase detector having a first input, a second input, and an output, wherein the first input is configured to receive a reference signal;
a frequency divider coupled between the VCO and the second input of the phase detector; and
a loop filter coupled between the output of the phase detector and the VCO.

11. The system of claim 1, wherein the first tunable capacitor comprises switchable capacitors coupled in parallel between a supply rail and the VCO.

12. A system, comprising:
a voltage-controlled oscillator (VCO), wherein the VCO includes an inductor and a voltage-controlled capacitor coupled in parallel between a first node and a second node;
a first second-order harmonic filter coupled to the VCO, wherein the first second-order harmonic filter includes a first tunable capacitor;
a second second-order harmonic filter coupled to the VCO, wherein the second second-order harmonic filter includes a second tunable capacitor;
a measurement circuit having a first input and a second input, wherein the first input of the measurement circuit is coupled to the first node, the second input of the measurement circuit is coupled to the second node, and the measurement circuit is configured to measure a voltage difference between the first node and the second node; and a control circuit coupled to the measurement circuit, the first tunable capacitor, and the second tunable capacitor, wherein:

the control circuit is configured to sequentially set the first tunable capacitor and the second tunable capacitor to each one of multiple capacitance settings; and the measurement circuit is configured to measure the voltage difference between the first node and the second node for each one of the multiple capacitance settings.

13. The system of claim 12, wherein:

the measurement circuit is configured to indicate the measured voltage difference for each one of the multiple capacitance settings to the control circuit; and the control circuit is configured to select one of the multiple capacitance settings based on the measured voltage differences for the multiple capacitance settings.

14. The system of claim 13, wherein the one of the multiple capacitance settings corresponds to a largest one of the measured voltage differences for the multiple capacitance settings.

15. A method for calibrating a first second-order harmonic filter and a second second-order harmonic filter coupled to a voltage-controlled oscillator (VCO), wherein the first second-order harmonic filter includes a first tunable capacitor and the second second-order harmonic filter includes a second tunable capacitor, the method comprising:

sequentially setting the first tunable capacitor and the second tunable capacitor to each one of multiple capacitance settings;

measuring a voltage swing of the VCO for each one of the multiple capacitance settings; and selecting one of the multiple capacitance settings based on the measured voltage swings for the multiple capacitance settings.

16. The method of claim 15, wherein the VCO includes an inductor-capacitor (LC) tank, and measuring the voltage swing of the VCO for each one of the multiple capacitance settings comprises measuring a voltage across the LC tank for each one of the multiple capacitance settings.

17. The method of claim 16, wherein the one of the multiple capacitance settings corresponds to a largest one of the measured voltage swings for the multiple capacitance settings.

18. The method of claim 15, wherein sequentially setting the first tunable capacitor and the second tunable capacitor to each one of the multiple capacitance settings comprises:

outputting a digital control code to the first tunable capacitor and the second tunable capacitor; and sequentially setting the digital control code to each of one multiple digital values, wherein each one of the multiple digital values corresponds to a respective one of the multiple capacitance settings.

* * * * *